United States Patent
Prajuckamol et al.

(10) Patent No.: US 8,759,978 B2
(45) Date of Patent: Jun. 24, 2014

(54) CHIP-ON-LEAD PACKAGE AND METHOD OF FORMING

(75) Inventors: Atapol Prajuckamol, Rayong (TH); Bih Wen Fon, Melaka (MY); Jun Keat Lee, Negeri Sembilan (MY)

(73) Assignee: Semiconductor Components Industries, LLC, Phoenix, AZ (US)

( * ) Notice: Subject to any disclaimer, the term of this patent is extended or adjusted under 35 U.S.C. 154(b) by 37 days.

(21) Appl. No.: 13/354,752

(22) Filed: Jan. 20, 2012

(65) Prior Publication Data

US 2013/0168866 A1    Jul. 4, 2013

(30) Foreign Application Priority Data

Dec. 29, 2011  (MY) .............................. PI 2011006354

(51) Int. Cl.
*H01L 23/48*    (2006.01)

(52) U.S. Cl.
USPC ............... 257/773; 257/E23.01; 257/E21.514

(58) Field of Classification Search
USPC ............. 257/773, E23.01, E21.514; 438/119
See application file for complete search history.

(56) References Cited

U.S. PATENT DOCUMENTS

| | | | |
|---|---|---|---|
| 5,313,102 A * | 5/1994 | Lim et al. | 257/787 |
| 5,373,188 A * | 12/1994 | Michii et al. | 257/666 |
| 5,519,576 A * | 5/1996 | Moore | 361/723 |
| 5,612,569 A * | 3/1997 | Murakami et al. | 257/666 |
| 6,069,029 A * | 5/2000 | Murakami et al. | 438/123 |
| 8,395,246 B2 * | 3/2013 | Yu et al. | 257/676 |
| 2003/0001252 A1 * | 1/2003 | Ku et al. | 257/686 |
| 2005/0248014 A1 * | 11/2005 | Tanaka et al. | 257/678 |
| 2005/0275089 A1 * | 12/2005 | Joshi et al. | 257/727 |
| 2007/0290364 A1 * | 12/2007 | Gupta et al. | 257/777 |
| 2008/0105988 A1 * | 5/2008 | Haag | 257/784 |
| 2008/0157299 A1 * | 7/2008 | Holloway et al. | 257/670 |
| 2008/0283981 A1 * | 11/2008 | Chou et al. | 257/670 |
| 2009/0102034 A1 * | 4/2009 | Pagkaliwangan et al. | 257/676 |
| 2009/0146282 A1 * | 6/2009 | Tay et al. | 257/686 |
| 2010/0052141 A1 * | 3/2010 | Robinson | 257/690 |
| 2010/0122454 A1 * | 5/2010 | Fan et al. | 29/827 |
| 2010/0127362 A1 * | 5/2010 | Fan et al. | 257/666 |
| 2010/0171201 A1 * | 7/2010 | Wyant et al. | 257/676 |
| 2011/0215454 A1 * | 9/2011 | Wang | 257/676 |
| 2011/0227175 A1 * | 9/2011 | Gupta et al. | 257/415 |
| 2012/0175756 A1 * | 7/2012 | Kim et al. | 257/676 |

* cited by examiner

*Primary Examiner* — Julio J Maldonado
*Assistant Examiner* — Jaehwan Oh
(74) *Attorney, Agent, or Firm* — Kevin B. Jackson

(57) ABSTRACT

In one embodiment, a chip-on-lead package structures includes an electronic chip having opposing major surfaces. One major surface of the electronic chip is attached to first and second leads. The one major surface is electrically connected to the first lead, and electrically isolated from the second lead. The other major surface where active device are formed may be electrically connected to the second lead.

20 Claims, 8 Drawing Sheets

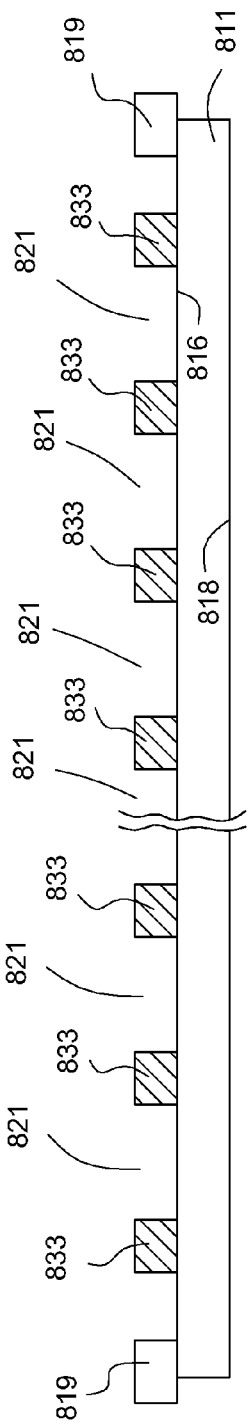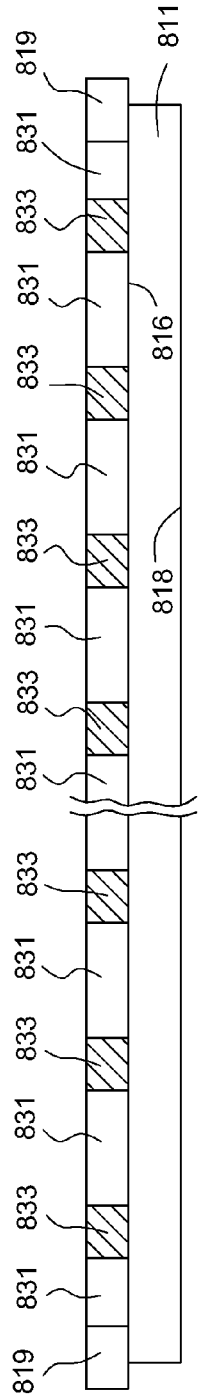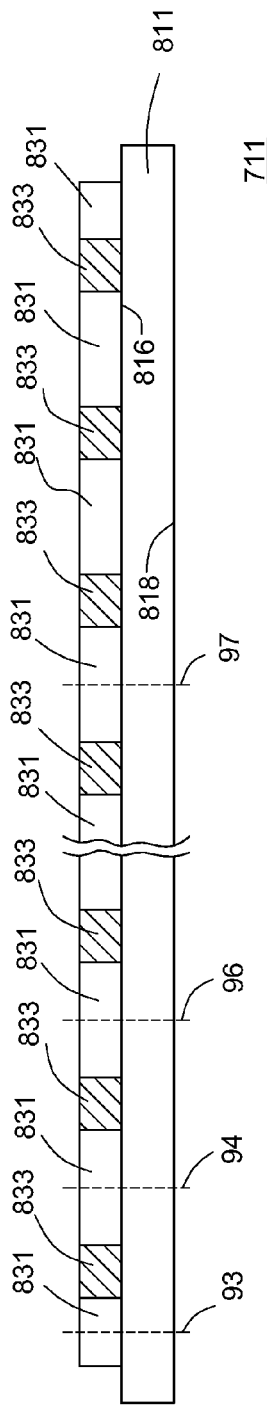

CHIP-ON-LEAD PACKAGE AND METHOD OF FORMING

BACKGROUND

This document relates generally to electronic devices, and more specifically to methods of forming packaged electronics devices and structures.

Chip-on-Lead ("COL") packaged electronic devices are a type of package where one major surface of an electronic device is attached directly to and supported by the package leads. One advantage of COL-type packages is that they allow for smaller footprint devices by eliminating conventional die-attach flag or pad structures. However, present COL-type packages have a disadvantage because present COL-type packages cannot be used in applications where the major surface attached to the package leads must also be connected to a separate electrical bias, such as ground.

Accordingly, structures and methods of manufacture are needed for COL-type packages that provide a separate electrical bias connection to a major surface of an electronic device that is adjacent to the package leads.

BRIEF DESCRIPTION OF THE DRAWINGS

FIGS. 11-16 illustrate cross-sectional views of a structure in accordance with the present invention at various stages of fabrication.

For simplicity and clarity of illustration, elements in the figures are not necessarily drawn to scale, and the same reference numbers in different figures denote generally the same elements. Additionally, descriptions and details of well-known steps and elements may be omitted for simplicity of the description.

DETAILED DESCRIPTION OF THE DRAWINGS

Figure 1:
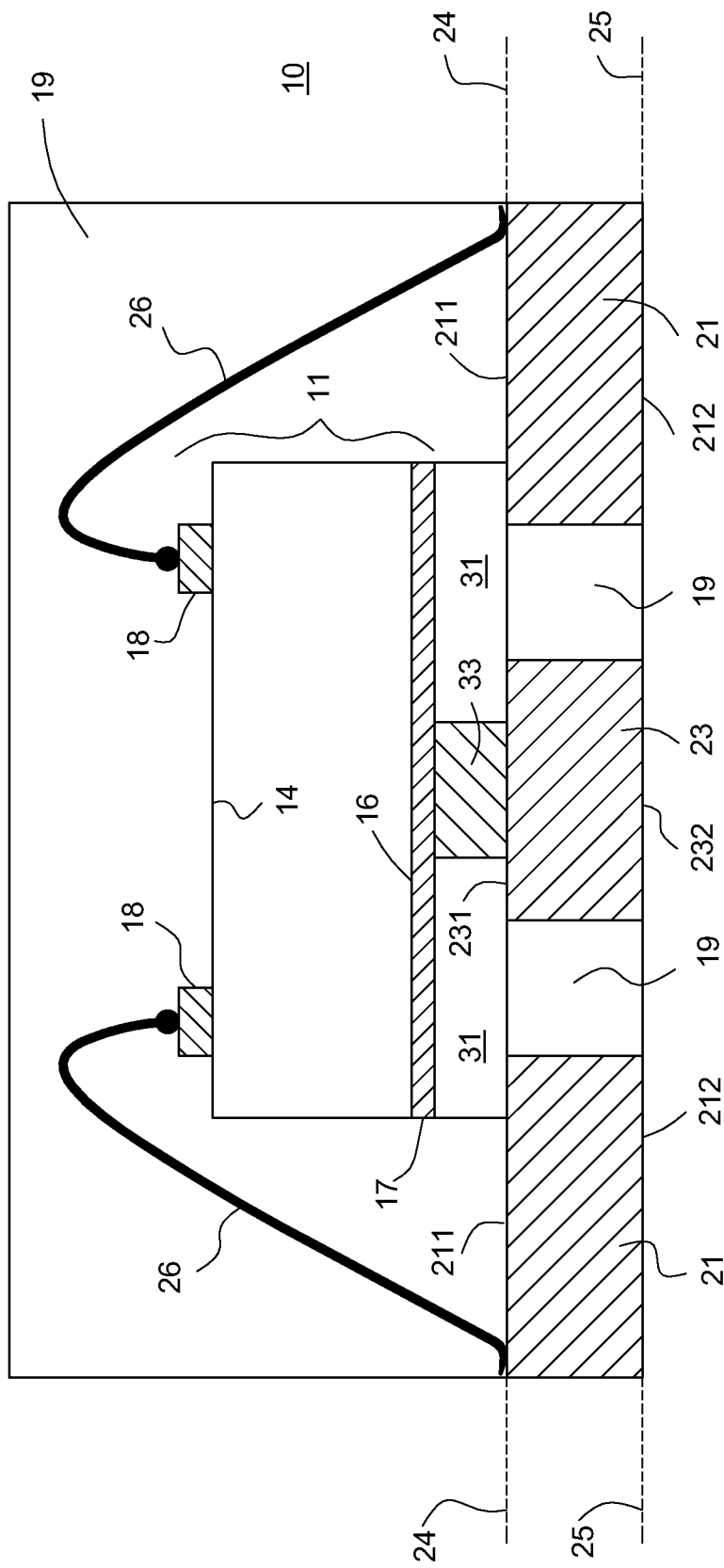
FIG. 1 illustrates a cross-sectional view of an electronic structure in accordance with a first embodiment of the present invention.

FIG. 1 shows a cross-sectional view of a packaged electronic device or structure 10 shown in a COL-type configuration in accordance with a first embodiment. In one embodiment, device 10 includes an electronic chip or component 11, which may be a physical component configured to affect the flow of electrons or their associated fields in a desired manner. By way of example, chip 11 may comprise a semiconductor device, such as a discrete device, an integrated circuit device, an optoelectronic device, an electromechanical sensor device, combinations thereof, or the like. In another embodiment, chip 11 may comprise, or may further comprise, a passive device or the like.

In one embodiment, chip 11 includes two opposing major surfaces 14 and 16. In one embodiment, individual electrical devices or individual doped regions may be formed adjacent major surface 14, and major surface 16 may be devoid of individual, patterned, or isolated electrical devices or doped regions. In one embodiment, major surface 14 may be referred to as the active device side or surface of chip 11. In one embodiment, chip 11 may include a conductive layer 17 formed overlying major surface 16. By way of example, conductive layer 17 may comprise a continuous or unpatterned metal layer or layers, such a titanium-nickel-silver, chromium-nickel-gold, or the like. In this embodiment, chip 11 may also include bonding pads 18 formed overlying major surface 14, which may be configured as input/output structures for electrical signals moving into or out of chip 11. In one embodiment, bonding pads 18 may comprise aluminum or an aluminum alloy. It is understood that chip 11 may include additional doped regions, doped layers, conductive layers, and/or insulating layers, which are not shown.

Device 10 further includes conductive leads 21 and a lead 23. In one embodiment, major surface 14 of chip 11 is connected to leads 21 using connective structures 26, which may comprise for example, wire bonds, ribbon bonds, clips, combinations thereof, or the like. In one embodiment, leads 21 and lead 23 may be in vertical alignment with each other. In one embodiment, surfaces 211 and 231 of leads 21 and lead 23 respectively substantially lie within the same horizontal plane represented in general by dashed line 24. In one embodiment, surfaces 212 and 232 of leads 21 and lead 23 respectively substantially lie within the same horizontal plane represented in general by dashed line 25.

In the present embodiment, an insulative region, an insulative layer or non-conductive layer of material 31 is formed between major surface 16 of chip 11 and major surfaces 211 of leads 21 and portions of major surface 231 of lead 23. In one embodiment, insulative layer 31 is formed overlying conductive layer 17. In one embodiment, insulative layer 31 may comprise a non-conductive adhesive material. In one embodiment, insulative layer 31 may comprise a non-conductive material that includes one or more epoxide groups (for example, a resin material or a thermoset polymer) or the like. In one embodiment, insulative layer 31 may be a non-conductive epoxy, and chip 11 may be attached to surfaces 211 leads 21 using the non-conductive epoxy as an adhesive. By way of example, insulative layer 31 may comprise an Ablestick™ brand of non-conductive adhesives, which are available from Henkel of Dusseldorf, Germany. In other embodiments, insulative layer 31 may comprise other dielectric materials, such as oxides, nitrides, polymeric plastics, or the like. In another embodiment, insulative layer 31 may be attached to leads 21 and portions of lead 23 using other intervening or intermediate bonding materials applied either to insulative layer 31 or leads 21 and 23. In accordance with the present embodiment, portions of major surface 16 overlie or overlap surfaces 211 of leads 21 in a COL-type configuration.

In accordance with the present embodiment, device 10 also includes a conductive structure(s) 33, which can be configured to directly or indirectly provide an electrical connection or path between major surface 16 of chip 11 and lead 23. In one embodiment, conductive structure 33 may be a conductive adhesive material. In one embodiment, conductive structure 33 may comprise a conductive adhesive material that includes one or more epoxide groups (for example, a resin material or a thermoset polymer) or the like. In one embodiment, conductive structure 33 is a conductive epoxy, and chip 11 is attached to surfaces 231 lead 23 using the conductive epoxy. By way of example, conductive structure 33 may comprise an Ablestick™ brand of conductive adhesives, which are available from Henkel of Dusseldorf, Germany. In another embodiment, conductive structure 33 may be attached to lead 23 using other bonding materials. In this embodiment, insulating layer 31 and conductive structure 33 may be formed overlying major surface 16 or conductive layer 17 (if used) before chip 11 is attached to leads 21 and lead 23.

Device 10 further includes an encapsulating layer or molded layer 19, which may enclose and protect portions of chip 11, connective structures 26, leads 21, and lead 23. In one embodiment, molded layer 19 may comprise a plastic material that may include resin, filler, pigments, reinforcements, plasticizers, and other materials. As configured in this embodiment, device 10 provides a structure that electrically connects major surface 16 of chip 11 to lead 23, and that electrically isolates major surface 16 and conductive layer 17 (if used) of chip 11 from leads 21.

Figure 2:
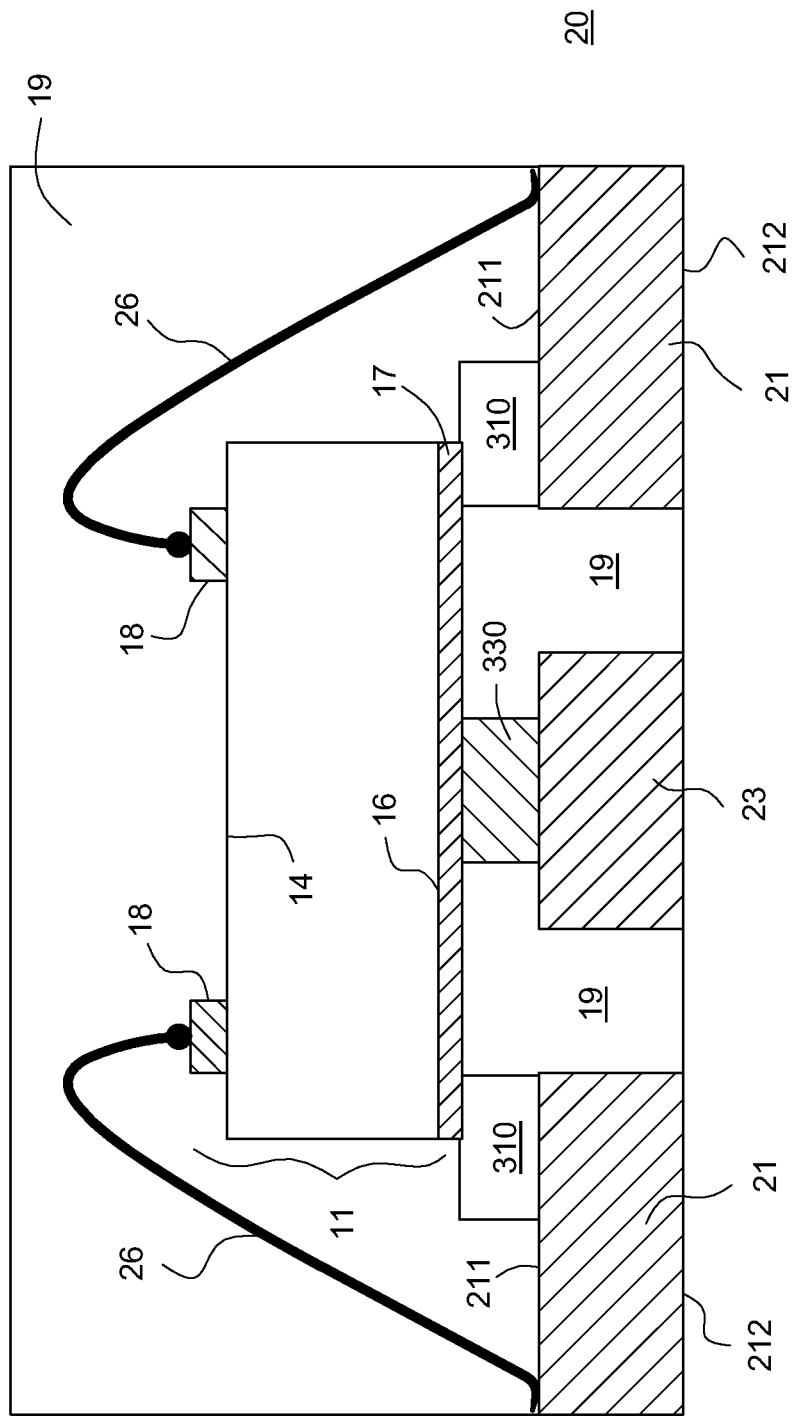
FIG. 2 illustrates a cross-sectional view of an electronic structure in accordance with a second embodiment of the present invention.

FIG. 2 shows a cross-sectional view of a packaged electronic device or structure 20 shown in a COL-type configuration in accordance with a second embodiment. Device 20 is similar to device 10 except that insulating layers 310 may be formed on portions of leads 21 and lead 23 (not shown), and conductive structure 330 is formed on another portion of lead 23. In one embodiment, this leaves portions of major surface 16 or conductive layer 17 (if used) exposed, which may be then covered by molded layer 19. In one embodiment, insulating layers 310 and conductive structure(s) 330 may be placed onto leads 21 and lead 23 before chip 11 is placed on insulating layers 310 and conductive structure(s) 330.

Figure 3:
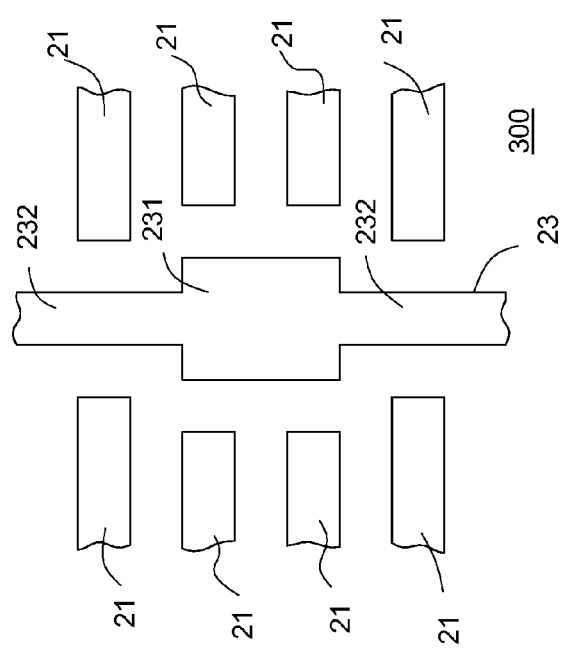
FIG. 3 illustrates a partial top view of a lead frame structure in accordance with an embodiment of the present invention.

FIG. 3 is a top view of a portion of a leadframe structure 300, which may be used in conjunction with device 10. In one embodiment, leadframe structure 300 may comprise a conductive material such as copper, and may include a plurality of conductive leads 21 that are spaced apart and in proximity to conductive lead 23. In one embodiment, lead 23 is substantially perpendicular to leads 21. In one embodiment, lead 23 includes a wider portion 231 to accommodate conductive structure 33, and narrower portions 232 that may extend away from wider portion 231.

Figure 4:
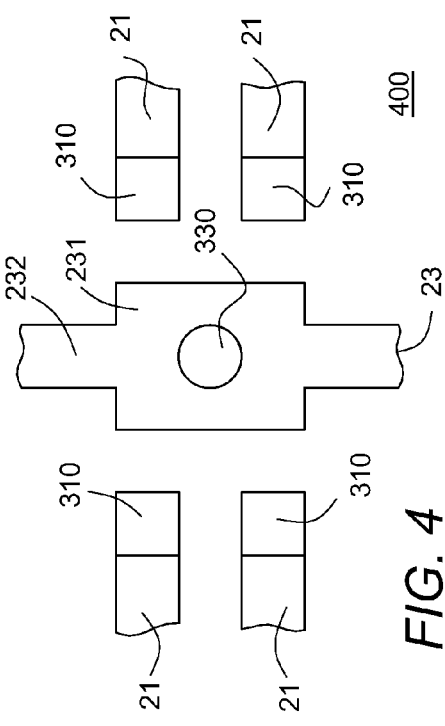
FIG. 4 illustrates a partial top a view of a lead frame structure in accordance with another embodiment of the present invention.

FIG. 4 is a top view of a portion of a leadframe structure 400, which may be used for example, in conjunction with device 20 shown in FIG. 2. Leadframe structure 400 may be similar to leadframe structure 300, but further includes insulative layers 310 formed on leads 21, and conductive structure 330 formed on lead 23. In one embodiment, conductive structure 330 is formed on wider portion 231. In one embodiment, insulative layers 310 may be formed on other portions of lead 23. As set forth previously, in one embodiment, materials for insulative layers 310 may include a non-conductive adhesive, and materials for conductive structure 330 may include a conductive adhesive.

Figure 5:
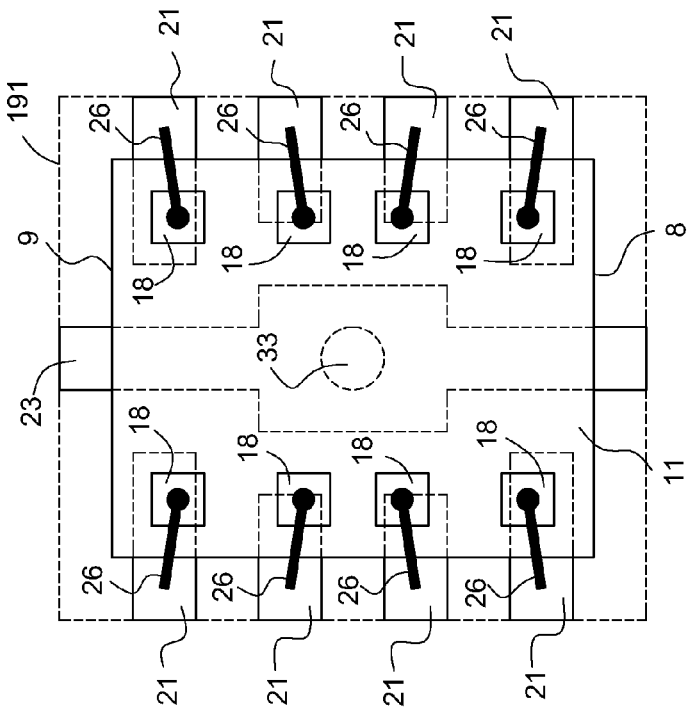
FIG. 5 illustrates a top view of another embodiment of the present invention.

FIG. 5 is a top view of a portion of devices 10 or 20 without molded layer 19. Dashed line 191 is provided as an example of an outline for molded layer 19 when subsequently formed. Conductive structure 33 and portions of leads 21 and lead 23 are shown in phantom as reference for one embodiment of device 10 or device 20. In one embodiment, lead 23 may extend beyond an edge 8 of chip 11 to beyond another edge 9 opposite to edge 8.

Figure 6:
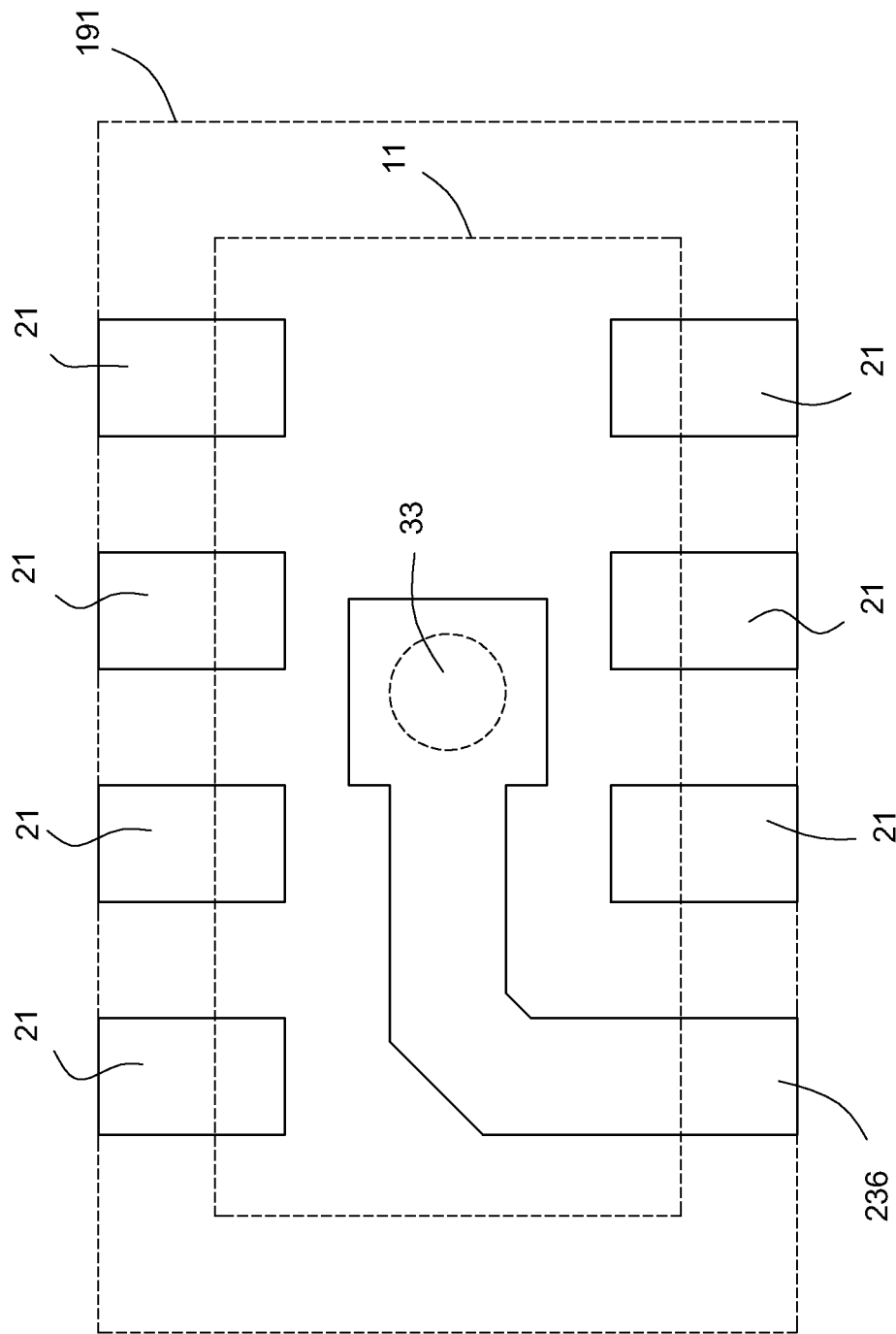
FIG. 6 illustrates a top view of a further embodiment of the present invention.

FIG. 6 is a top view of another embodiment of a portion of devices 10 or 20 without molded layer 19. This embodiment is similar to the embodiment of FIG. 5, except lead 236 that is electrically coupled to major surface 16 of chip 11 may be an angled lead that terminates on the same side as a portion of leads 21.

Figure 7:
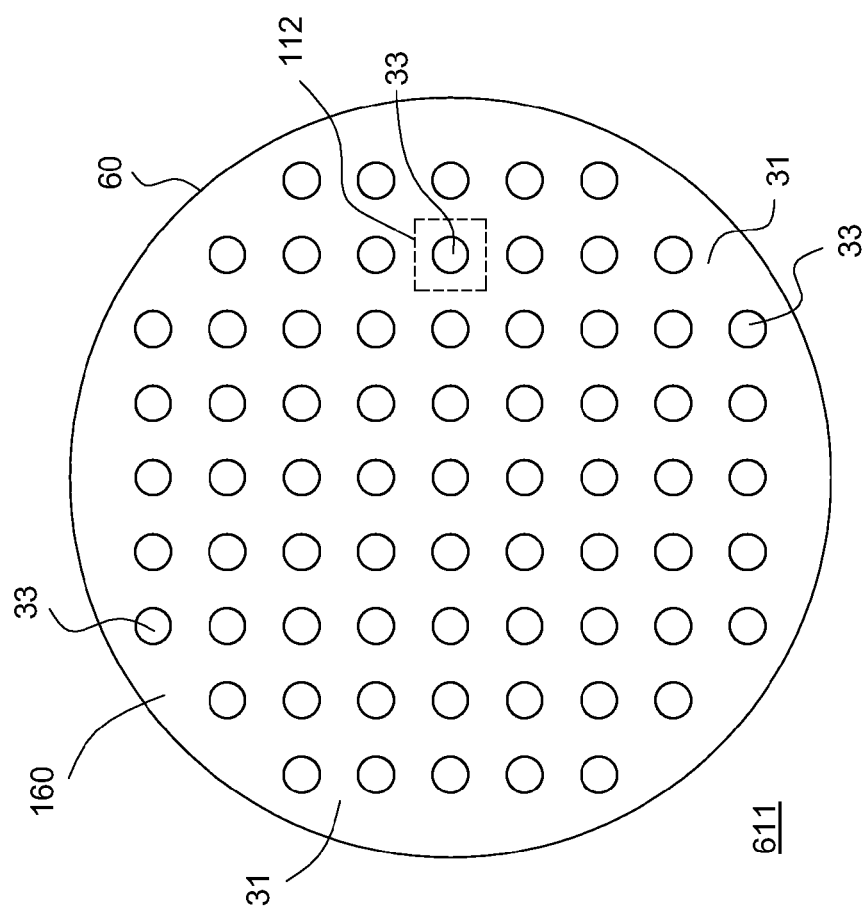
FIG. 7 illustrates a bottom view of a still further embodiment of a structure in accordance the present invention.

FIG. 7 is a simplified view of an electronic device structure 611 at an intermediate stage of fabrication. Structure 611 is example embodiment of a interim step for making a chip 11 suitable for use with device 10. Structure 611 may include a substrate 60. In one embodiment, substrate 60 may comprise a semiconductor material, and substrate 60 may include a major surface 160 with insulative layer 31 formed overlying major surface 160. In one embodiment, openings may be formed in insulative layer 31 and conductive structures 33 are formed within the openings to provide an electrical path through insulative layer 31 to major surface 160. In one embodiment, a conductive layer (not shown) may be formed between major surface 160 and insulative layer 31. An example of an outline for chip 11 is shown as a dashed line 112 in FIG. 7, and it is understood that substrate 12 may include a multitude of chips 11.

Figure 8:
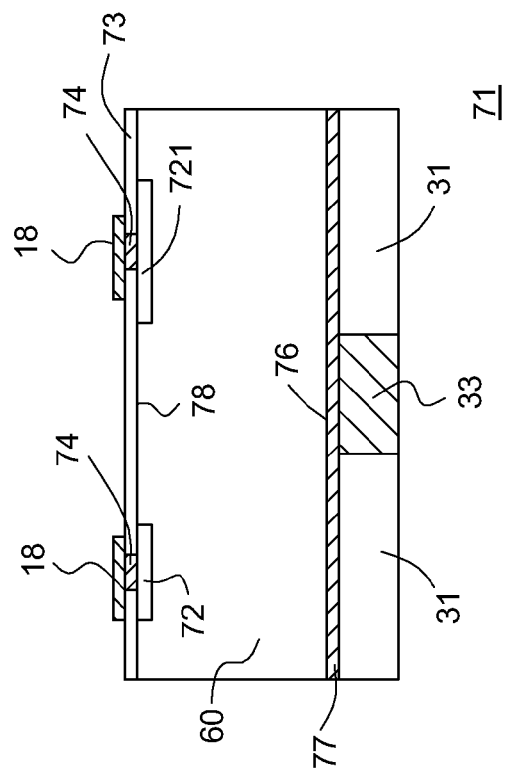
FIG. 8 illustrates a cross-sectional view of a semiconductor device in accordance with an embodiment of the present invention.

FIG. 8 is a cross-sectional view of a semiconductor device or chip 71 for use with, for example, device 10. Semiconductor device 71 is shown for example, after separation from substrate 60, and includes insulative layer 31 and conductive structure 33 formed adjacent major surface 76. Semiconductor device 71 may include doped regions 72 and 721 extending from a major surface 78 of substrate 60, which may form active and/or passive devices. Conductive structures 74 electrically connect doped regions 72 and 721 to bonding structures 18. An insulative layer 73 such as a silicon oxide, a silicon nitride, combinations thereof or the like may be formed overlying doped regions 72 and 721 and major surface 73. An optional conductive layer 77 may be formed overlying a major surface 76 of substrate 60. In one embodiment, insulative layer 31 and conductive structure 33 may be formed adjacent major surface 76. In another embodiment, insulative layer 31 and conductive structure 33 may be formed adjacent conductive layer 77. In a typical embodiment, major surface 76 is devoid of any active individual devices with such devices formed instead in proximity to major surface 78. In this embodiment, semiconductor device 71 is configured for a COL-type package with an electrical connective path to major surface 76 through conductive structure 33.

Figure 10:
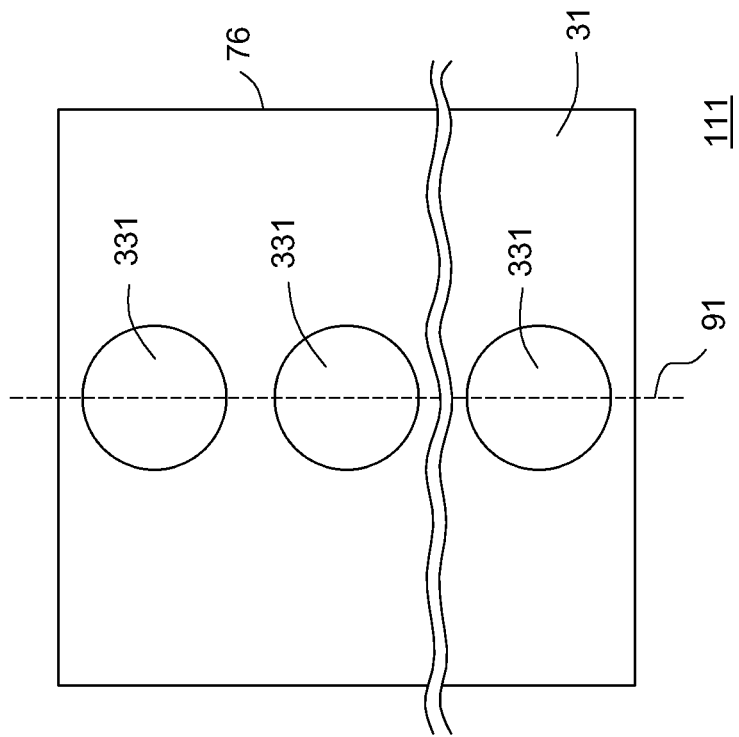
FIGS. 9-10 illustrate bottom views of alternative embodiments of electronic devices in accordance with the present invention.
Figure 9:
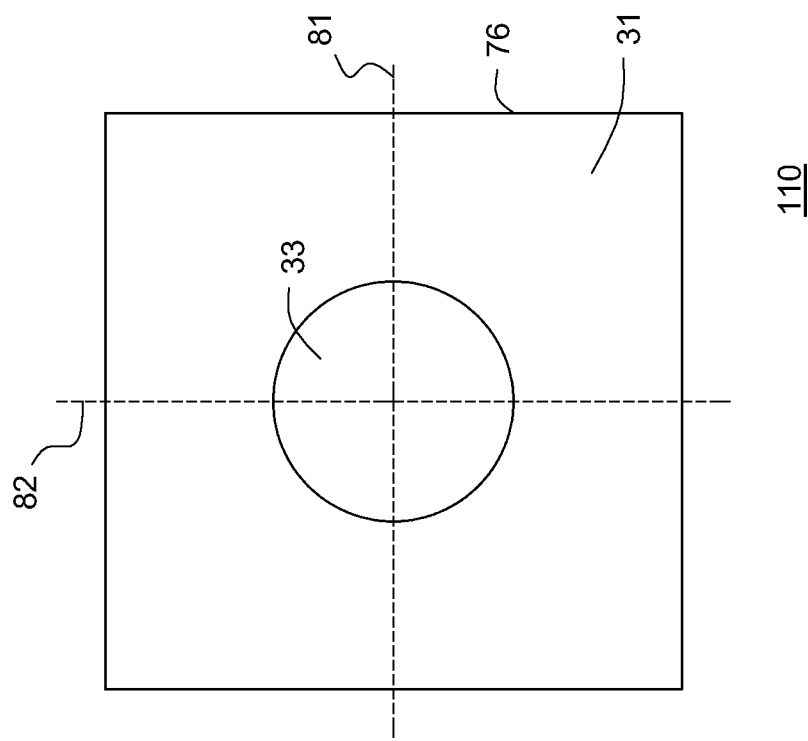

FIG. 9 is a view of a chip 110 with insulative layer 31 and conductive structure 33 facing upward. In one embodiment, conductive structure 33 is located in a substantially centrally portion of major surface 76 as generally represented by lines 81 and 82. FIG. 10 is a view of alternative embodiment of a chip 111 with an insulative layer 31 and conductive structures 331 facing upward. In this embodiment, multiple or more than one conductive structures 331 may be used. In one embodiment, conductive structures 331 may be placed along a substantially centralized location as generally represented by line 91.

Figure 11:
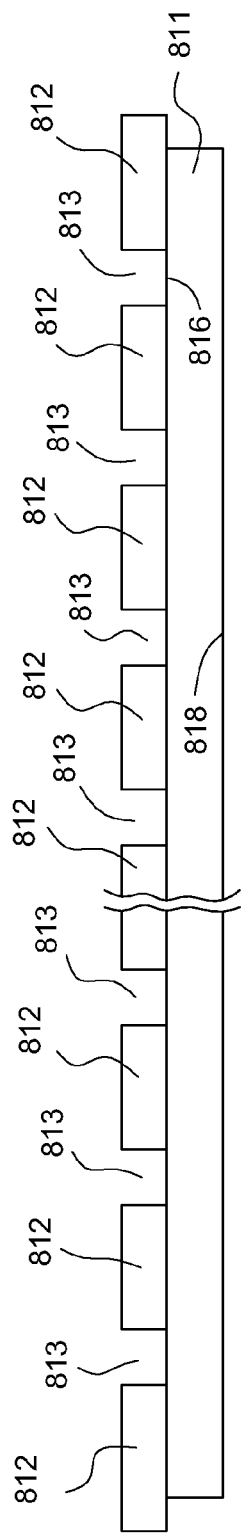

Turning now to FIGS. 11-16, a method of forming an electronic device structure 711 is described. FIG. 11 shows an enlarged cross-section view of structure 711 at an early step in fabrication. In this example, a substrate 811 may be provided having opposing major surfaces 818 and 816. In one embodiment, substrate 811 may be a semiconductor substrate, and at this point in the process, doped regions, insulating layers, and conductive layers (not shown) may be formed on and/or in major surface 818. In one embodiment, major surface 818 may be devoid of insulative layers, active devices, and individually doped regions, but may include a common or blanket doped region extending across major surface 818. In one embodiment, substrate 811 may be a finished semiconductor wafer having a multitude of individual semiconductor chips (not shown) formed in proximity to major surface 818. In one embodiment, a conductive layer (not shown), such as conductive layer 77 may be formed overlying major surface 816. A patterned layer or mask layer 812 may be formed overlying major surface 816, which may leave portions of major surface 816 exposed through openings or vias 813. In one embodiment, patterned layer 812 may comprise a stencil material. Such materials are available from companies, such as DEK International of Dorset, England.

Figure 12:
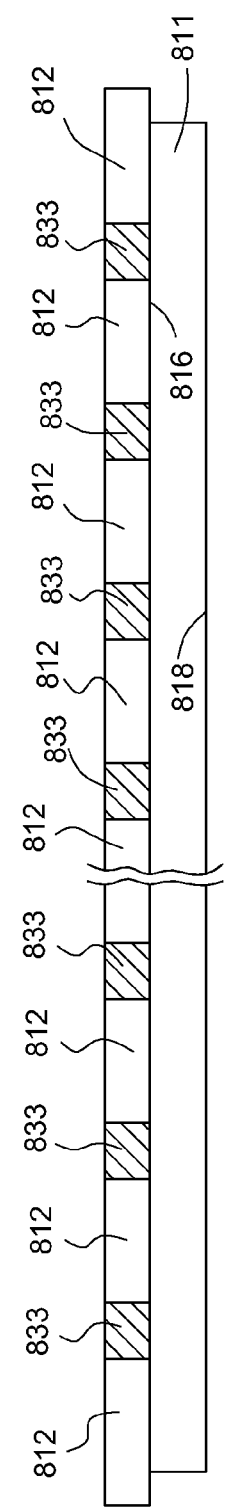

FIG. 12 shows structure 711 after further processing. Conductive structures 33 may be formed within openings 813. In one embodiment, conductive structures 33 may be attached to a conductive layer overlying major surface 816. In one embodiment, conductive structures may be attached directly to major surface 816. In one embodiment, other intervening conductive layers may be used between conductive structures 833 and major surface 816. Conductive structures 833 may comprise materials similar to conductive structures 33. In one embodiment, conductive structures 833 may comprise a conductive epoxy adhesive, and conductive structures 833 may be formed using, for example, a screen printing process.

Figure 13:
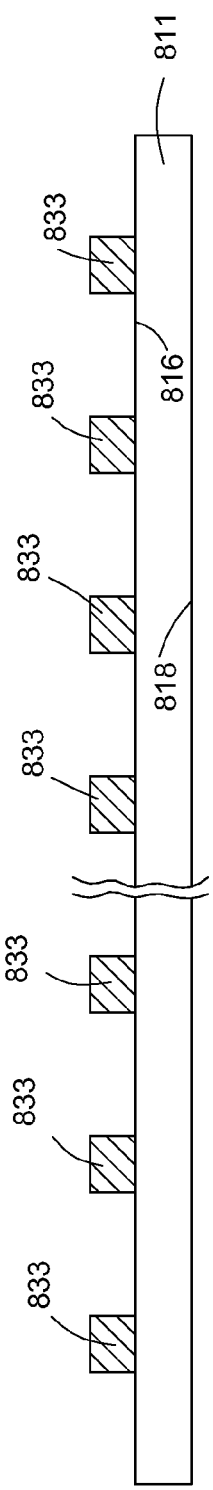

FIG. 13 is an enlarged cross-sectional view of structure 711 after additional processing in which patterned layer 812 may be removed. At this step, if conductive structures 833 comprise conductive epoxy adhesive, the conductive epoxy adhesive may be cured. In a subsequent step, a patterned layer or mask layer 819 may be formed overlying portions of major surface 816 as shown in FIG. 14. In one embodiment, mask layer 819 may comprise a stencil material, and may be configured to leave an opening or opened portion 821 that exposes portions of major surface 816 between conductive structures 833 for example, as shown in FIG. 14. Next, insulative layer 831 may be formed within opening 821 as shown in FIG. 15. In one embodiment, insulative layer 831 may comprise the same materials as insulative layer 31. In one embodiment, insulative layer 831 may comprise a non-conductive epoxy adhesive, and insulative layer 831 may be formed using, for example, a screen printing process.

FIG. 16 is an enlarged cross-sectional view of structure 711 after mask layer 819 has been removed. In subsequent processing, structure 711 may be separated into individual components, such as chips 11 or 71. Dashed lines 93 and 94 represent an example of one set of separation lines, and dashed lines 96 and 97 represent an example of another set of separation lines. Once separated the individual components may then be placed onto, for example, leads 21 and 23 as shown in FIG. 1. In accordance with one embodiment, conductive structure 833 provides a conductive path between substrate 811 and the lead that conductive structure 833 is connected to, and insulative layer 831 isolates major surface 816 from leads that insulative layer 831 is attached to.

From all of the foregoing, one skilled in the art can determine that according to one embodiment, an electronic device structure comprises an electronic device (for example, element 11, 71, 110, 111, 711) having first and second opposing major surfaces (for example, element 14, 16, 76, 78, 816, 818). A plurality of conductive pads (for example, elements 18) is formed on the first major surface, and an insulative layer (for example, element 31, 310, 831) is formed adjacent a portion of the second major surface. At least one conductive structure (for example, element 33, 330, 833) is formed adjacent another portion of the second major surface and electrically coupled to the second major surface. A plurality of first conductive leads (for example, element 21) are attached to the insulative layer so that the electronic device overlaps the plurality of conductive leads in a chip-on-lead configuration, where at least some of the plurality of first conductive leads are coupled to at least a portion of plurality of conductive pads (for example, elements 26). A second conductive lead (for example, element 23, 236) is coupled to the at least one conductive structure.

Those skilled in the art will also appreciate that according to another embodiment, in the structure described in paragraph [0024], one of the insulative layer (for example, element 31, 310, 831) and the at least one conductive structure (33, 330, 833) comprises an epoxy material.

Those skilled in the art will also appreciate that according to yet another embodiment, an electronic device structure comprises a first conductive lead (for example, element 21) and a second conductive lead (for example, element 23, 236). An electronic device (for example, element 11, 71, 110, 111, 711) having first and second opposing major surfaces (for example, elements 14, 16, 76, 78, 816, 818), wherein the electronic device overlaps the first and second leads in a chip-on-lead configuration, and wherein the second major surface (for example, element 16, 76, 816) is electrically coupled to the second conductive lead, and wherein the second major surface is electrically isolated from the first conductive lead.

Those skilled in the art will also appreciate that according to an additional embodiment the structure described in paragraph [0026], wherein the second major surface is electrically coupled to the second conductive lead with a conductive epoxy material.

Those skilled in the art will also appreciate that according to a further embodiment, the structure described in paragraph [0026], wherein the second major surface is electrically isolated from the first conductive lead with a non-conductive epoxy material.

Those skilled in the art will also appreciate that according to a still further embodiment, the structure described in paragraph [0026] further comprises an encapsulating material (for example, element 19) formed over at least portions of the first and second conductive leads and the electronic device.

Those skilled in the art will also appreciate that according to yet an additional embodiment, a method for forming electronic device structure comprises the steps of providing an electronic chip (for example, element 11, 71, 110, 111, 711) having first and second opposing major surfaces (for example, elements 14, 16, 76, 78, 816, 818). The method includes providing a first plurality of conductive leads (for example, element 21) and providing a second conductive lead (for example, element 23, 236). The method includes attaching the electronic chip to the first plurality of conductive leads and the second conductive lead in a chip-on-lead configuration, wherein an insulative layer (for example, element 31, 831) is formed between the second major surface (for example, element 16, 76, 816), and the first plurality of conductive leads, and wherein a conductive structure (for example, element 33, 330, 833) is formed between the second major surface and the second conductive lead.

Those skilled in the art will also appreciate that according to one more embodiment, in the method set forth in paragraph [0030], the step of attaching the electronic chip includes attaching the electronic chip to the first plurality of conductive leads using a non-conductive epoxy material.

Those skilled in the art will also appreciate that according to a further embodiment, in the method set forth in paragraph [0030], the step of attaching the electronic chip includes attaching the electronic chip to the second conductive lead using a conductive epoxy material.

In view of all the above, it is evident that a novel structure and method is disclosed. Included, among other features, is an electronic device attached to leads in a chip-on-lead configuration where an insulative layer isolates a portion of the lower major surface of the electronic device from a plurality of conductive leads. A conductive structure electrically connects another portion of lower major surface of the electronic device to another conductive lead. Among other things, the structure allows for independent electrical biasing of the lower major surface of the electronic device.

Although the subject matter of the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. An electronic device structure comprising:
an electronic device having first and second opposing major surfaces;
a plurality of conductive pads on the first major surface;
an insulative layer adjacent a portion of the second major surface;
at least one conductive structure adjacent another portion of the second major surface and electrically coupled to the second major surface;
a plurality of first conductive leads coupled to the insulative layer so that the electronic device overlaps the plurality of first conductive leads in a chip-on-lead configuration, where at least some of the plurality of first conductive leads are coupled to at least a portion of plurality of conductive pads; and
a second conductive lead coupled to the at least one conductive structure.

2. The structure of claim 1, where the plurality of first conductive leads and the second conductive lead substantially lie in the same plane.

3. The structure of claim 1, where the second conductive lead is substantially perpendicular to the plurality of first conductive leads and extends from one edge of the electronic device to another edge opposite to the one edge.

4. The structure of claim 1, where the second conductive lead includes a first portion having a first width and a second portion having a second width.

5. The structure of claim 4, where the first width is greater than the second width, and where the first portion is coupled to the at least one conductive structure.

6. The structure of claim 1, where one of the insulative layer and the at least one conductive structure comprises an epoxy.

7. The structure of claim 1, where the electronic device comprises a semiconductor device, and wherein the second major surface is devoid of individual doped regions.

8. The structure of claim 7 further comprising a conductive layer between the second major surface and the insulative layer.

9. The structure of claim 1 further comprising an encapsulating layer covering the electronic device structure, where portions of the plurality of first conductive leads and a portion of the second conductive lead are exposed through the encapsulating layer.

10. The structure of claim 1, where the at least one conductive structure is located in a substantially centrally portion of the second major surface.

11. An electronic device structure comprising:
a first conductive lead;
a second conductive lead; and
an electronic device having first and second opposing major surfaces, wherein the electronic device overlaps the first and second leads in a chip-on-lead configuration, and wherein the second major surface is electrically coupled to the second conductive lead, and wherein the second major surface is electrically isolated from the first conductive lead.

12. The structure of claim 11 further comprising a conductive pad overlying the first major surface, wherein the conductive pad is electrically coupled to the first conductive lead.

13. The structure of claim 11, wherein the second major surface is electrically coupled to the second conductive lead with a conductive epoxy material.

14. The structure of claim 11, wherein the second major surface is electrically isolated from the first conductive lead with a non-conductive epoxy material.

15. The structure of claim 11 further comprising an encapsulating material over at least portions of the first and second conductive leads and the electronic device.

16. An electronic package comprising:
a plurality of first conductive leads and a second conductive lead;
an insulative layer overlying at least a portion of the plurality of first conductive leads;
at least one conductive structure overlying a portion of the second conductive lead; and
an electronic device having first and second opposing major surfaces, wherein the second opposing major surface is overlying the insulative layer and a portion of the plurality of first conductive leads so that the electronic device overlaps the plurality of first conductive leads, and wherein the second opposing major surface is overlying the at least one conductive structure and a portion of the second conductive lead, and wherein the second opposing surface is electrically coupled to the second conductive lead by the at least one conductive structure.

17. The electronic package of claim 16 further comprising:
a plurality of connective structures electrically coupled to the first opposing major surface and to at least some of the plurality of first conductive leads.

18. The electronic package of claim 16, where the plurality of first conductive leads and the second conductive lead substantially lie in the same plane, such that the electronic package is devoid of an electronic device pad.

19. The electronic package of claim 16, wherein the second conductive lead provides for independent electrical biasing of the second opposing major surface of the electronic device.

20. The electronic package of claim 16, wherein the insulative layer also overlies a portion of the second conductive lead.

* * * * *